(12) United States Patent
Philipp

(10) Patent No.: US 8,791,910 B2
(45) Date of Patent: Jul. 29, 2014

(54) CAPACITIVE KEYBOARD WITH POSITION-DEPENDENT REDUCED KEYING AMBIGUITY

(75) Inventor: Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 187 days.

(21) Appl. No.: 13/043,231

(22) Filed: Mar. 8, 2011

(65) Prior Publication Data

US 2011/0157085 A1    Jun. 30, 2011

Related U.S. Application Data

(63) Continuation of application No. 11/750,430, filed on May 18, 2007, now Pat. No. 7,903,092.

(60) Provisional application No. 60/803,138, filed on May 25, 2006.

(51) Int. Cl.
*G06F 3/041* (2006.01)

(52) U.S. Cl.
USPC ............................................. 345/173

(58) Field of Classification Search
USPC ............................... 341/22–33; 345/173–179
See application file for complete search history.

(56) References Cited

U.S. PATENT DOCUMENTS

| | | | |
|---|---|---|---|
| 5,730,165 A | 3/1998 | Philipp | |
| 5,734,928 A * | 3/1998 | Nakasuji | 710/67 |
| 5,748,512 A | 5/1998 | Vargas | |
| 6,452,514 B1 | 9/2002 | Philipp | |
| 6,466,036 B1 | 10/2002 | Philipp | |
| 6,677,932 B1 | 1/2004 | Westerman | |
| 6,993,607 B2 | 1/2006 | Philipp | |
| 7,336,206 B2 | 2/2008 | Sugimara | |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |

(Continued)

FOREIGN PATENT DOCUMENTS

| | | |
|---|---|---|
| DE | 1970 02 225 C1 | 5/1998 |
| EP | 1 381 160 A1 | 1/2004 |
| WO | WO 2012/129247 | 9/2012 |

OTHER PUBLICATIONS

Office Action and English Translation for German Patent Application 10 2007 024 455.1, Dec. 7, 2011.

(Continued)

*Primary Examiner* — Waseem Moorad
(74) *Attorney, Agent, or Firm* — Baker Botts LLP

(57) ABSTRACT

In one embodiment, a method includes receiving two or more output signals responsive to two or more capacitive couplings. Each of the capacitive couplings has occurred between a pointing object and one of two or more sensing areas within a sensing region, and each of the sensing areas has a position within the sensing region. The method includes, if two or more of the output signals each have an output-signal level that exceeds a predefined activation level, then selecting a particular one of the sensing areas with output-signal levels exceeding the predefined activation level as an intended one of the sensing areas based on a predefined ranking scheme that takes into account the positions of the sensing areas within the sensing region.

37 Claims, 5 Drawing Sheets

(56) References Cited

U.S. PATENT DOCUMENTS

| | | |
|---|---|---|
| 8,049,732 B2 | 11/2011 | Hotelling |
| 8,179,381 B2 | 5/2012 | Frey |
| 2004/0140913 A1 | 7/2004 | Engelmann |
| 2004/0169636 A1* | 9/2004 | Park et al. .................... 345/156 |
| 2004/0183833 A1 | 9/2004 | Chua |
| 2005/0246459 A1* | 11/2005 | Philipp ......................... 710/67 |
| 2006/0192690 A1* | 8/2006 | Philipp ......................... 341/22 |
| 2007/0273561 A1 | 11/2007 | Philipp |
| 2007/0287494 A1 | 12/2007 | You |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

OTHER PUBLICATIONS

UK Intellectual Property Office, Search and Examination Report in corresponding application GB0709905.4, Sep. 28, 2007.

Office Action for British Application No. 0709905.4, Jun. 9, 2009.

Office Action and English translation for German Application Serial No. 10 2007 024 455.1, Feb. 17, 2010.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

H. Philipp, U.S. Appl. No. 11/750,430, Non-final Office Action from USPTO, Apr. 5, 2010.

H. Philipp, U.S. Appl. No. 11/750,430, Response to Non-final Office Action, Aug. 4, 2010.

H. Philipp, U.S. Appl. No. 11/750,430, Notice of Allowance from USPTO, Oct. 29, 2010.

L. Hristov, U.S. Appl. No. 11/750,588, Non-final Office Action from USPTO, Mar. 23, 2010.

L. Hristov, U.S. Appl. No. 11/750,588, Response to Non-final Office Action, Jun. 21, 2010.

L. Hristov, U.S. Appl. No. 11/750,588, Request for Continued Examination, Dec. 7, 2010.

L. Hristov, U.S. Appl. No. 11/750,588, Non-final Office Action from USPTO, Dec. 27, 2010.

L. Hristov, U.S. Appl. No. 11/750,588, Response to Non-final Office Action, May 27, 2011.

L. Hristov, U.S. Appl. No. 11/750,588, Final Office Action from USPTO, Sep. 6, 2011.

L. Hristov, U.S. Appl. No. 11/750,588, Request for Continued Examination, Dec. 6, 2011.

L. Hristov, U.S. Appl. No. 11/750,588, Non-final Office Action from USPTO, Mar. 28, 2012.

L. Hristov, U.S. Appl. No. 11/750,588, Response to Non-final Office Action, Jun. 28, 2012.

L. Hristov, U.S. Appl. No. 11/750,588, Final Office Action from USPTO, Jul. 25, 2012.

L. Hristov, U.S. Appl. No. 11/750,588, Request for Continued Examination, Nov. 26, 2012.

L. Hristov, U.S. Appl. No. 11/750,588, Non-final Office Action from USPTO, Dec. 21, 2012.

L. Hristov, U.S. Appl. No. 11/750,588, Response to Non-final Office Action, Apr. 22, 2013.

L. Hristov, U.S. Appl. No. 11/750,588, Final Office Action from USPTO, Jun. 12, 2013.

L. Hristov, U.S. Appl. No. 11/750,588, Request for Continued Examination, Nov. 12, 2013.

L. Hristov, U.S. Appl. No. 11/750,588, Notice of Allowance, Nov. 21, 2013.

\* cited by examiner

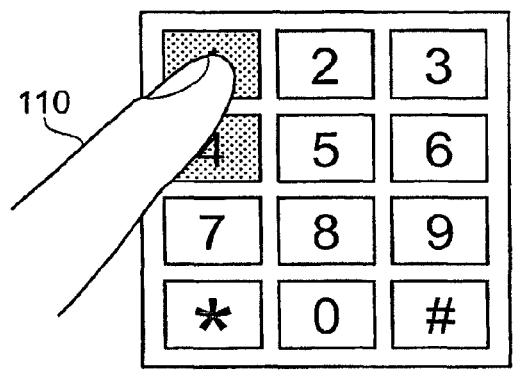
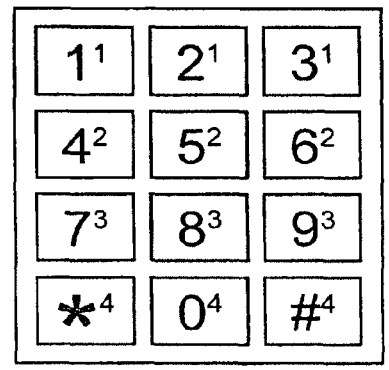
Fig. 2            Fig. 3
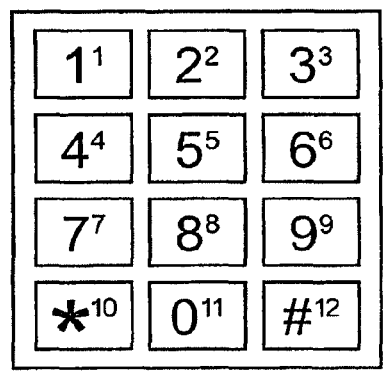
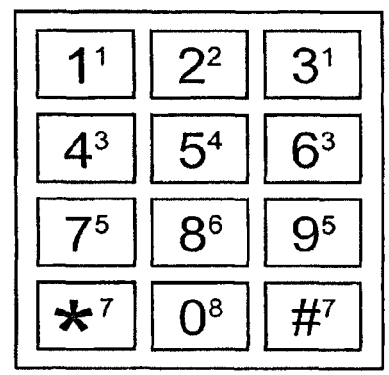
Fig. 4            Fig. 5

CAPACITIVE KEYBOARD WITH POSITION-DEPENDENT REDUCED KEYING AMBIGUITY

RELATED APPLICATION

This application is a continuation, under 35 U.S.C. §120, of U.S. patent application Ser. No. 11/750,430, filed 18 May 2007, which claims the benefit, under 35 U.S.C. §119(e), of U.S. Provisional Patent Application No. 60/803,138, filed 25 May 2006.

TECHNICAL FIELD

This disclosure relates generally to capacitive keyboards.

BACKGROUND OF THE INVENTION

The invention relates to touch sensitive user interfaces having an array of sensing elements and methods for determining which of a plurality of sensing elements in simultaneous detection is intended by a user for selection. Thus the invention relates to a method and apparatus for controlling touch sensitive user interfaces, e.g. to assist in preventing accidental false inputs from keys adjacent to a selected key in a capacitive keyboard.

The use of capacitive proximity sensors, for example as keys in a keypad, is becoming more common. Capacitive sensors are frequently preferred to mechanical switches for a number of reasons. For example, capacitive sensors require no moving parts and so are less prone to wear than their mechanical counterparts. Capacitive sensors can also be made in relatively small sizes so that correspondingly small, and tightly packed keypad arrays can be provided. Furthermore, capacitive sensors can be provided beneath an environmentally sealed outer surface. This makes their use in wet environments, or where there is a danger of dirt or fluids entering a device being controlled attractive. Furthermore still, manufacturers often prefer to employ interfaces based on capacitive sensors in their products because such interfaces are often considered by users to be more aesthetically pleasing than conventional mechanical input mechanisms (e.g. push-buttons).

However, a drawback of interfaces based on arrays of capacitive sensors is that an object to be sensed, e.g. a user's pointing finger, will often be capacitively coupled to multiple capacitive sensors at the same time. This means that multiple capacitive sensors can appear to be activated simultaneously which can lead to an ambiguity as to which capacitive sensor in the array is intended for selection. This problem can be particularly apparent for sensors arranged into a closely packed array, e.g. in a keypad for a cellular telephone. With a small keypad such a this, a user's finger is likely to overlap multiple keys at the same time, i.e. both an intended key for selection, and also keys adjacent to it. This can be especially problematic if the user has large fingers, or if he presses on a panel over the sensors with enough force to deform his or her finger and so increase the effective area of his finger tip. The same sort of effect is found when a conducting film is spilled on a keyboard, in which case the user's finger is sensed as though it were the size of the puddle. Problems of this sort are particularly acute in cash register keyboards used in food service establishments where beverage and food sauce spills are a frequent occurrence. Another problem with capacitive keypads, known as the "handshadow" effect, arises because of the capacitive response to a body other than the pointing body, e.g., sensing the user's hand in addition to sensing his or her pointing finger.

U.S. Pat. No. 5,730,165 teaches a capacitive field sensor employing a single coupling plate and a method of detecting a change in capacitance of the coupling plate, $C_x$, to ground. The apparatus taught in U.S. Pat. No. 5,730,165 comprises pulse circuitry for charging the coupling plate and for subsequently transferring the charge from the plate into a charge detector, which may be a sampling capacitor, $C_s$. The transferring operation is carried out by means of a transfer switch electrically connected between the coupling plate and the charge detector. The disclosure of U.S. Pat. No. 5,730,165 is herein incorporated by reference.

U.S. Pat. No. 6,466,036 teaches pulse circuitry for measuring capacitance to ground, the circuitry comprising a plurality of electrical switching elements, each of which has one side electrically connected to either a power supply voltage or to a circuit ground point. This circuit arrangement, which may be used with a keyboard as well as for many other applications, is more compatible with available integrated circuit design and manufacturing practices than is prior art pulse circuitry, which commonly had one side of at least one switching element floating. These improved arrangements thereby provide superior performance at a lower manufacturing cost. The disclosure of U.S. Pat. No. 6,466,036 is herein incorporated by reference.

Attempts made to address the above-described problem of keying ambiguity with capacitive sensors are described in U.S. Pat. No. 6,993,607 and U.S. patent Ser. No. 11/402,269 (published as US 2006/0192690 A1). The disclosures of U.S. Pat. No. 6,993,607 and U.S. Ser. No. 11/279,402 are herein incorporated by reference.

U.S. Pat. No. 6,993,607 describes a method and apparatus for reducing keying ambiguity on a keyboard having an array of proximity sensors. The ambiguity is reduced by an iterative technique of repeatedly measuring a detected signal strength associated with each key in the array having respective output signals responsive to a degree of coupling between the key and a user, comparing all of the measured signal strengths to find a maximum, determining that the key having the maximum signal strength is the unique user-selected key, and maintaining the user selected key until the signal from that key falls below a threshold value. The signals from all the other keys are suppressed or ignored during the maintaining step.

U.S. Ser. No. 11/402,269 (published as US 2006-0192690 A1) describes an iterative method and apparatus for removing keying ambiguity on a keyboard by measuring a detected signal strength associated with each key in an array, comparing the measured signal strengths to find a maximum, determining that the key having the maximum signal strength is the unique user-selected first key, and maintaining that selection until either the first key's signal strength drops below some threshold level or a second key's signal strength exceeds the first key's signal strength. When any key is selected its signal strength value may be enhanced relative to all the other keys so as to deselect all other keys.

SUMMARY OF THE INVENTION

According to a first aspect of the invention there is provided a touch-sensitive user interface, comprising: a plurality of sensing areas arranged within a sensing region, each sensing area having a position within the sensing region; a measurement circuit coupled to the sensing areas and operable to generate output signals responsive to a coupling between a pointing object and respective ones of the sensing areas; and a controller operable to receive the output signals from the measurement circuit and to determine a selected one of the sensing areas by taking account of both the output signals associated with the sensing areas and the positions of the sensing areas within the sensing region.

The user interface may further be operable to output an output signal indicative of the selected one of the sensing areas.

The user interface may be based on capacitive effects, i.e. such that the coupling between a pointing object and respective ones of the sensing areas is a capacitive coupling. The user interface may alternatively be based on other coupling mechanisms, for example magnetic coupling.

By taking account of the positions of sensing areas within the sensing region as well as their associated output signals, the controller is able to more reliably determine which one of a plurality of sensing areas (keys) in a sensing region (keypad/keyboard) in simultaneous detection is intended by a user for selection. This is because the controller may be configured to take account of which keys in a keypad are more likely to be wrongly selected as being intended by a user by virtue of their positions, in particular with respect to the orientation of the pointing object. For example, in a keypad in which a pointing object normally passes over a given key or keys when a user selects a desired key, the controller can in effect suppress signals from the non-user selected keys over which the pointing object passes based on their positions.

For example, each sensing area may be associated with a predefined priority ranking according to its position within the sensing region, and the controller may be operable to preferentially select sensing areas according to their ranking. Thus for a keypad comprising keys arranged in rows and columns, keys in a top row (relative to the orientation of a pointing object) may be assigned a higher rank than keys in a lower row, and hence be preferentially selected over them.

The ranking scheme may be applied such that the highest ranked key in a plurality of keys deemed to be in simultaneous activation based on their output signals, is taken to be the user selected key. In the event that multiple activated keys have the same ranking, and this ranking is the highest ranking of all activated keys, conventional techniques may be used to determine which key to select. For example, for the keys having the same (and highest) priority, the key having the biggest output signal, the key being first to be activated, or a random one of the keys, may be selected. Alternatively, a null response may be reported (i.e. no key selected), thus forcing the user to re-adjust their pointing.

Alternatively, the ranking scheme may be such that the controller is arranged to determine the selected one of the sensing areas by applying a weighting to the output signals according to the positions of the corresponding sensing areas in the sensing region. The weighting may be applied by scaling the output signals by a scale factor associated with the corresponding sensing areas so that sensing areas associated with higher scale factors are preferentially selected over sensing areas having lower scale factors. This has the advantage of allowing an activated key having a lower ranking than another activated key to still be selected if its output signal is sufficiently high, that is to say, a sufficiently high output signal can overcome a lower ranking. This can help, for example, if there is a concern that complete "block out" of the lowest ranked key(s) might otherwise occur.

The controller may be operable to take account of the positions of the sensing areas within the sensing region when determining the selected one of the sensing areas by preferentially selecting sensing areas having positions nearer to predefined parts of the sensing region over sensing areas having positions farther from the predefined parts of the sensing region. For example, the predefined parts of the sensing region may be parts that are furthest from the user along a direction in which a pointing object approaches the screen. This in effect suppresses the sensing areas in parts of the sensing region that the pointing object passes over when a user wished to select a sensing area in one of the predefined parts of the sensing region (e.g. a top row, or a top corner) of the sensing region.

The user interface may be such that in normal use a pointing object approaches the sensing region from a normal approach direction (which will likely also correspond with a direction of extent of the pointing object), and sensing areas are preferentially selected according to their positions along the normal approach direction. Furthermore, the user interface may be such that in normal use the pointing object approaches the sensing region from one of a plurality of normal approach directions, and sensing areas are preferentially selected according to their positions along the more than one normal approach directions. Thus the controller can be operable to determine a user-selected key taking particular account of how the user interface is normally oriented with respect to a user.

The sensing areas may be arranged in rows and columns, and the controller may take account of the positions of the sensing areas when determining a selected sensing area by preferentially selecting sensing areas in one row over sensing areas in another row. Furthermore, or alternatively, sensing areas in one column may be preferentially selected over sensing areas in another column.

The touch-sensitive user interface may further comprise a further plurality of sensing areas arranged within a further sensing region, each further sensing area having a position within the further sensing region, wherein the measurement circuit is coupled to the further sensing areas and operable to generate further output signals responsive to a coupling (e.g. a capacitive or magnetic coupling) between the pointing object and respective ones of the further sensing areas; and wherein the controller is further operable to receive the further output signals from the measurement circuit and to determine a selected one of the further sensing areas by taking account of both the further output signals associated with the further sensing areas and the positions of the further sensing areas within the further sensing region.

Where the touch-sensitive user interface comprises such a further plurality of sensing areas, the controller may be further operable to determine a selected one of the selected one of the first-mentioned sensing areas and the selected one of the further sensing areas based on the output signals associated with these selected sensing areas.

According to a second aspect of the invention there is provided an apparatus/device comprising a touch-sensitive user interface according to the first aspect of the invention. The apparatus/device, may, for example, be a cellular telephone, an oven, a grill, a washing machine, a tumble-dryer, a dish-washer, a microwave oven, a food blender, a bread maker, a drinks machine, a computer, an item of home audio-visual equipment, a portable media player, a PDA, and so on.

According to a third aspect of the invention there is provided a method for determining which one of a plurality of sensing areas in a sensing region of a touch-sensitive user interface is selected by a pointing object, the method comprising: measuring a coupling (e.g. a capacitive coupling or a magnetic coupling) between the pointing object and respective ones of the sensing areas and generating output signals responsive thereto; and determining one of the sensing areas to be the selected sensing area by taking account both the output signals associated with the sensing areas and the positions of the sensing areas within the sensing region.

The method may further comprise outputting an output signal indicative of the sensing area determined to be the selected sensing area.

Other aspects and features of the invention are as follows.

One aspect of the invention is that it may provide a method of removing keying ambiguity by measuring a detected signal associated with each key in an array, comparing the measured signals, determining that an upper key having a signal in relation to a lower key signal is the unique user-selected key, and maintaining that selection until either the upper key's signal strength drops below some threshold level or a second key's signal strength exceeds the upper key's signal strength. When an upper key and a lower key are pressed by a user, the upper key is preferentially selected and its signal strength value may be enhanced relative to the other key(s) so as to deselect the other key(s). In this aspect, the array under consideration may be a keyboard, or any convenient subset thereof.

The present invention provides an improvement over U.S. Pat. No. 6,466,036 and U.S. application Ser. No. 11/279,402 (published as US 2006-0192690 A1) in that an upper key of a keypad can be preferentially selected over a lower key or keys even if the signal from the upper key is weaker than the signal from the lower key or keys. This is particularly advantageous for small keyboards or keypads, like mobile phones which are becoming increasingly smaller in size with improvements in technology and due to consumer demand requiring ever more miniature and 'slim' handsets. With small mobile handsets the keys can be spaced very closely together which means that it is difficult to press the intended keys, especially if the user has large fingers. Often a user may accidentally press more than one key at the same time including the intended key the user wished to select. The invention allows an upper key to be selected by suppressing the signal from other adjacent keys that may also have been pressed or from which capacitive coupling may have been detected, as the upper key is often the intended key of the user.

The invention may be used in combination with the teaching of U.S. Ser. No. 11/279,402 (published as US 2006-0192690 A1), although when it is recognised that there is a signal associated with an upper key and a signal associated with a lower key on a keypad, the upper key may be preferentially selected over the lower key. Therefore, the present invention may be referred to as 'position-dependent' key ambiguity reduction and this may override the detection integrator counter (DI) system disclosed in U.S. Ser. No. 11/279,402 (published as US 2006-0192690 A1) when touch from a group of keys is capacitively detected and there is an upper/lower key relationship between the keys.

U.S. Ser. No. 11/279,402 (published as US 2006-0192690 A1) discloses an embodiment with an array of capacitive keys in which each key has a respective detection integrator counter (DI) associated with it. Each DI is a clocked counter that counts up by one incremental value on each capacitive acquisition cycle during which a signal strength from the associated key is above some nominal threshold value, and that counts down toward zero if the signal strength is less than the nominal value. A controller receives a respective input from each DI and determines that one of the keys is selected, e.g., wins, when the detection integration (DI) count associated with that key meets a respectively selected terminal count value, TC. The incremental magnitude used for counting down can be the same as that for counting up, e.g., 1, or it can be different, e.g., 2, to preferentially accelerate the count-down 'losing' process over the winning process, in order to facilitate better suppression of noise. The rate of counting down any of the DI counters can also be the complete value, i.e., the DI can be cleared in one cycle. In this embodiment, when two or more keys have signal strengths above their nominal thresholds, the key with the lesser signal strength will have its associated DI decremented or cleared each cycle while this condition exists. If any two or more keys have equal and maximal signal strengths, such keys' DI's will continue to increment until the first to reach its TC 'wins' and is set as the unique user-selected key.

In another embodiment, the DI of a key selected at a first instant may be decremented or cleared and that key deselected even if the signal strength of that key is above the threshold value and its DI equals its associated TC value, if second key becomes selected at a later instant by virtue of its signal strength being greater than the signal strength of the first key while also being above its own threshold value and having its associated DI equal its associated TC. If there are multiple keys with signal strengths above their associated threshold values, their associated DIs will count up and down in competition, until one key's DI finally equals its TC and wins over all others including over the previously selected key.

In the above discussions, it should be understood that the principle of having one signal greater than another has been somewhat simplified for explanatory purposes. In order to avoid indecisiveness and eliminate oscillation between two or more keys having more or less the same signal strengths, the winning key may preferably be given a slight advantage in subsequent repetitions of the decision process. This may be done, for example, by requiring a non-selected key's signal to exceed the currently selected key's signal by a small amount. This can be done by subtracting a small amount off the signals of non-selected keys, or by adding a small amount onto the selected key's signal.

In an embodiment, if the signal strengths of two keys that are approaching a detection threshold value and that are both in a defined keyboard neighborhood both exceed the threshold value and their signal strengths are equal to each other (or are within a selected tolerance value) at the same time, an algorithm executed by a controller may be used to declare one of the two keys to be active and the other to be inactive. It will be recognized that a wide variety of algorithms are possible and include, but are not limited to, a random, or pseudo-random selection of the active key, or a declaration of activity based on which key was scanned first. In an alternative embodiment, if two keys exceed the threshold value and their signal strengths are equal to each other at the same time, an algorithm executed by a controller may be used to cancel the signal from both keys until the user presses the intended key again so that one signal can be identified as having a maximum signal strength.

Those skilled in the keyboard arts will understand that the above-mentioned neighborhoods can be defined in a wide variety of ways. In some cases, a neighborhood of a given key may consist of the keys immediately adjacent the given key, or may comprise the keys having no more than one key between them and the given key. In other cases, the neighborhood may comprise all the keys in a matrix array—e.g., in a keyboard for use in a numerical data entry application in which only one key is to be active at a time so that the sequence of input digits is uniquely determined. In other cases, such as in a typing or computer-input keyboard, the neighborhood of a key may comprise all other keys in the keyboard except for special purpose keys, such as a capitalization shift key, a control key, and the like. Moreover, a keyboard may be configurable by a user who programs a controller to selectively consider or ignore various keys in an array. In some cases there might be two neighborhoods, each acting independently of the other for key ambiguity resolution purposes.

Although it is believed that the foregoing rather broad summary description may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed in the following Detailed Description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

It will be appreciated that features described above in connection with one aspect of the invention will often be equally applicable to, and may be combined with, other aspects of the invention.

BRIEF DESCRIPTION OF THE DRAWINGS

For a better understanding of the invention and to show how the same may be carried into effect reference is now made by way of example to the accompanying drawings in which:

FIG. 2 schematically shows in plan view a sensing region portion of the UI shown in FIG. 1;

FIG. 3 schematically shows a priority ranking scheme for keys of the keypad shown in FIGS. 1 and 2 according to an embodiment of the invention;

FIGS. 4 and 5 schematically show priority ranking schemes for keys of the keypad shown in FIGS. 1 and 2 according to other embodiments of the invention;

DETAILED DESCRIPTION OF PREFERRED EMBODIMENTS

Figure 1:
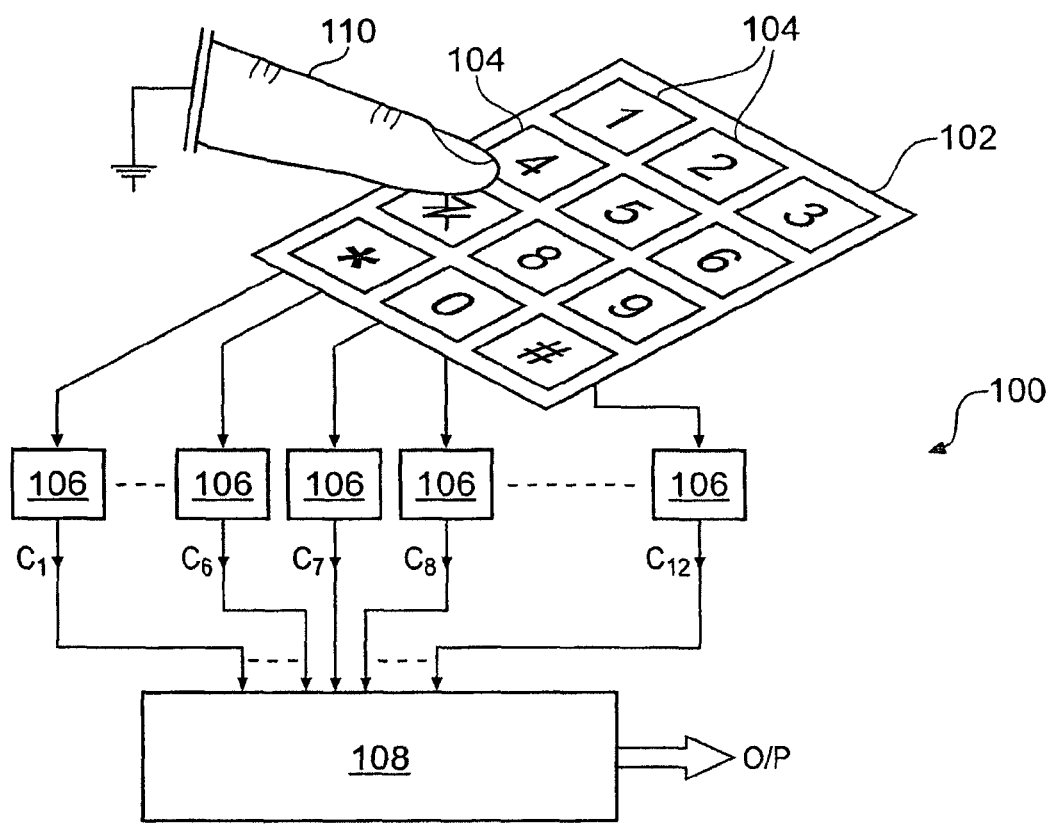
FIG. 1 schematically shows in perspective view a touch sensitive user interface (UI) according to an embodiment of the invention.

FIG. 1 schematically shows in perspective view a touch sensitive user interface (UI) 100 according to an embodiment of the invention. The UI comprises a sensing region 102 having an array of discrete capacitive sensing areas 104. In this example there are twelve sensing areas arranged in a three-by-four array. The sensing region 102 may conveniently be referred to as a keyboard or keypad and the sensing areas 104 may conveniently be referred to as keys. Also shown in FIG. 1 is a pointing object 110, in this case a user's finger, approaching the keypad to select one of the keys.

The keypad 102 may be of conventional design. In this embodiment the keypad is formed of a plastic substrate having discrete areas of conductive material deposited on the underside thereof to provide sensing electrodes. The shapes and locations of the electrodes define the shapes and locations of the corresponding sensing areas of the keyboard/keypad.

The sensing electrodes are coupled to respective ones of a plurality of capacitance measurement channels 106 in a capacitance measurement circuit. The capacitance measurement channels are for measuring the capacitive coupling of the associated electrodes to a system reference (ground) potential, and generating corresponding output signals $C_{1-12}$ indicative of the measured capacitances. The capacitance measurement channels may be of any known kind. For example circuitry based on RC circuits, relaxation oscillators, phase shift measurements, phase locked loop circuitry, or capacitive divider circuitry may be used. In this example the capacitance measurement channels are based on charge transfer techniques, such as those described in U.S. Pat. No. 5,730,165 or U.S. Pat. No. 6,466,036. Here separate capacitance measurement channels are provided for each key in the keypad. However, in other embodiments fewer capacitance measurement channels, e.g. a single channel, may be used with appropriate multiplexing.

The UI 100 further includes a controller 108. The controller is for receiving the output signals $C_{1-12}$ from the capacitance measurement channels and determining from the received output signals which (if any) of the keys is selected by a user, and outputting a corresponding key-selection output signal O/P. The key-selection output signal O/P may then be passed to and acted upon as appropriate by a main controller of the device associated with the UI in the normal way. The controller functionality may be provided by a suitably programmed general purpose processor, for example, or by means of special purpose hardware. For example the controller 108 may comprise a suitably configured application specific integrated circuit (ASIC), a field programmable gate array (FGPA), or an arrangement of discrete components.

The keypad in this example corresponds in layout with that of a typical telephone. Thus the twelve sensing areas (keys) 104 are respectively associated with the numbers 0 to 9, and the symbols * (star) and # (hash), as indicated in the figure. The sensing region is overlain with graphic decals to indicate to a user the shape and location of the underlying electrodes which define the sensitive areas of the keys, and also their associated functions. To select a desired key, a user moves his finger towards the appropriate part of the sensing area (as indicated to him by the graphic decal overlay), so that his finger is brought into proximity with the corresponding electrode. This act of selecting a key will sometimes be referred to as "pressing" a key. However, it will be understood that the term is used for convenience, and should not be interpreted as necessarily implying any form of physical contact between the pointing object and the selected sensing area.

In FIG. 1, the user is shown selecting the key associated with the number 7. The proximity of the user's finger to the electrode associated with number 7 increases the capacitive coupling of the electrode to ground. This leads to a change in the output signal from the associated capacitance measurement channel. Depending on the nature of the capacitance measurement channels used, an increase in capacitive coupling may lead to either an increase in output signal (direct relationship) or a decrease in output signal (inverse relationship). For simplicity, and unless the context demands otherwise, references to an increased output signal should be read throughout this description as meaning a change in the output signal which indicates an increase in the measured capacitive coupling of the associated electrode to ground, irrespective of whether there is a direct or an inverse relationship between the measured capacitance and the output signal (i.e. irrespective of whether parameterization of the output signal employed by the type of capacitance measurement channel goes up or down in response to an increase in measured capacitance). The controller is operable to determine if the characteristics of an increase in measured capacitance (e.g. magnitude, duration) are such that the key should be deemed to be in an activated state. This can be done according to conventional techniques, for example by requiring a predefined activation output signal level to be exceeded, and furthermore may employ techniques such as thresholding, drift compensation, filtering etc.

Thus, referring to FIG. 1, the proximity of the user's finger to the desired key, here key "7", increases the output signal $C_7$ associated with the key by an amount that leads the controller to determine that key "7" is activated (e.g. because the output signal has remained changed by a large enough amount for a long enough period). However, as noted above, it will generally be the case that the presence of the user's finger 110 adjacent to the sensitive area of the desired key "7" will also cause an increase in the capacitive coupling to ground of neighboring keys within the sensing region due to the proximity of the user's finger to these keys also. What is more, the increase in output signal associated with the keys not intended for selection may be sufficient for the controller to determine that the output signals from these keys also meet the requirements for being considered activated. Thus for the case shown in FIG. 1, the output signals associated with keys "4", "5", "8", "0", and "*" might also show significant increases in response to the approach of the user's finger, and may thus appear to be activated. The "*" key is likely to be most significantly effected because in addition to the user's finger tip being near to this key, the main body of the user's finger is also located over it (handshadow). Because of this the "*" key may even show a greater change in output signal than key "7".

The following describes how the controller 108 for the UI shown in FIG. 1 is operable to determine which key is to be taken as being intended for selection by the user when multiple keys show a sufficient increase in output signal that they meet the requirements for being considered activated according to one embodiment of the invention.

A consideration in determining the most likely one of multiple simultaneously activated keys intended for selection by a user according to embodiments of the invention is the orientation of the sensing region (keypad) relative to the normal direction of approach of a pointing object during normal use. For simplicity, terms such as upper, lower, left, right, etc. are used here to describe the relative positions of keys in the sensing region according to an orientation in which a direction of extent of a pointing object, which will generally also correspond to an approach direction, is substantially parallel to a direction running from a lower part to an upper part of the keypad. Thus for a mobile (cellular) telephone keypad such as shown in FIG. 1, a user will normally select keys with his finger approaching from a direction substantially parallel to the columns and running from the row containing keys "*", "0" and "#" to the row containing keys "1", "2" and "3" (as schematically shown in FIG. 1). Thus the row containing keys "*", "0" and "#" may be referred to as a lowermost (bottom) row of the keypad, and the row containing keys "1", "2" and "3" may be referred to as an uppermost (top) row of the keypad. This terminology will be used notwithstanding the fact that the user may hold the telephone such that the plane of the keypad is arbitrary (e.g. horizontal). Similarly, the column containing keys "1", "4", "7" and "*" may be referred to as a leftmost column of the keypad, and the column containing keys "3", "6", "9" and "#" may be referred to as a rightmost column of the keypad.

FIG. 2 schematically shows in plan view the sensing region portion 102 of the UI shown in FIG. 1 with the user's finger 110 shown in a position in which he intends to select key "1". The user's finger is sufficiently close to the intended key "1" that the change in output signal $C_1$ associated with this key is such that the controller determines the key to be activated. This is schematically shown in the figure by shading of the key "1". The user's finger also increases the output signal from the other keys in the keypad, most notably keys "2", "5" and "4". Here it is assumed that key "4" is most significantly affected. This is because key "4" is located below the intended key, and so the direction of extent of the user's finger runs directly over this key (handshadow). It is thus assumed that key "4" is also deemed to meet the requirements for being considered activated. Key "4" is thus also shown shaded in the figure. Keys "2" and "5" are assumed in this case not to be sufficiently affected to be deemed activated and so are not shaded in FIG. 2. In this situation (at least for cases in which only one key may be determined as being selected at any one time) the controller needs to decide which of keys "1" and "4" is to be taken as being intended for selection by the user so that an appropriate key selection output signal O/P from the UI can be generated.

In a conventional touch sensitive user interface, the choice of which of keys "4" and "1" should be taken as being the user-selected key (i.e. the key intended for selection by the user) will typically be based on either the magnitude of the output signals associated with the two keys (i.e. the key displaying the greatest output signal is deemed to be the selected key), or based on timing (i.e. the key which becomes activated first is deemed to be the selected key). However, both of these approaches can readily lead to incorrect determinations. For example, although in FIG. 2 the user intends to select key "1", the change in output signal $C_4$ associated with key "4" might in fact be larger. This could be due to the additional capacitive coupling provided by the main body of the user's finger to ground (handshadow), or simply because key "4" is more sensitive than key "1". Touch sensitive keys in an array will in general have differing sensitivities. Differences in sensitivity can be caused both by manufacturing tolerances and environmental effects (e.g. one key might be nearer to a ground plane, which will tend to reduce its sensitivity). Furthermore, although the user intends to select key "1", the characteristics of the change in output signal $C_4$ associated with key "4" may be such that key "4" is deemed to be activated (goes into activation) first. E.g., because in selecting key "1" the user's finger first moves over key "4". Thus conventional key-selection schemes based on magnitude or timing can both readily lead to an incorrect determination of the intended key.

User interfaces according to embodiments of the invention overcome this problem by taking account of both the output signals from the keys in the keypad and their positions within the keypad when determining a user selected one of the sensing areas (i.e. the intended key). This may be achieved by preferentially selecting from the activated keys according to the position of the keys in the keypad, i.e. by assigning a priority to each key in the keypad according to its position, and preferentially selecting keys having higher priorities.

FIG. 3 schematically shows a priority ranking scheme for keys of the keypad shown in FIGS. 1 and 2 according to an embodiment of the invention. For each key the priority rank is shown as a superscript to the symbol associated with the key function. Thus all of the keys on the uppermost (top) row are assigned a priority rank 1. These are the highest priority keys, the keys being of equal priority to one another. The keys "4", "5 and "6" are all assigned priority rank 2. Keys "7", "8 and "9" are assigned priority rank 3. Finally the keys on the lowest row (relative to an approaching finger) are assigned the lowest priority rank 4.

In determining which of a plurality of keys deemed to be in simultaneous activation is to be taken as being the user intended key for selection, the controller is operable to take account of the relative priority ranking of the activated keys.

One way of doing this is in an absolute manner, e.g. in which the highest ranked key in activation is deemed to be the selected key (in the case of multiple selected keys of the same highest rank, the key having the highest rank and greatest output signal, or the key having the highest rank to have gone into activation first, may be selected, for example). Thus referring to FIGS. 2 and 3, keys "1" and "4" are in activation. Key "1" has a ranking of 1 and key 4 has a ranking of 2. Thus key "1" is deemed to be the user-intended key for selection because it is of higher priority (rank 1) than key "4" (rank 2).

Another way in which the controller may take account of the relative priority ranking for the activated keys is by output signal weighting to preferentially select keys at positions associated with higher rankings. Thus the controller may be arranged to apply a weighting to the output signals according to the positions of the corresponding keys in the sensing region. For example, a scale factor may be associated with each priority rank (i.e. so that each key is associated with a predefined scale factor) and keys associated with higher scale factors may be preferentially selected over keys having lower scale factors. For example, and again referring to FIGS. 2 and 3, a priority rank of 1 might be associated with a scale factor of 2, a priority rank of 2 might be associated with a scale factor of 1.5, a priority rank of 3 might be associated with a scale factor of 1.0, and a priority rank of 4 might be associated with a scale factor of 0.5. Thus for the case shown in FIG. 2, the output signals of the activated keys are scaled in accordance with their respective predefined scale factors. The key having the highest weighted output signal is then deemed to be the selected key. This has the advantage over the above-described absolute priority ranking scheme in that a lower ranked key can still be selected over a higher ranked key if its output signal is sufficiently high compared to that of the higher-ranked key (i.e. the lowest ranked keys are not too strongly blocked out from selection).

In some examples based on output signal weighting there may not be a step of first determining which keys are in activation. Instead the output signals from all keys may be scaled by their appropriate predefined scale factors and key having the greatest weighted output signal taken to be the selected key. (Possibly after first determining that the greatest weighted output signal meets predefined requirements for reporting a selection, such as magnitude and duration of signal, to avoid the controller reporting a selected key when the keypad is not in fact in use.)

FIG. 4 is similar to and will be understood from FIG. 3. However, FIG. 4 shows an alternative ranking scheme for the keys of the keypad shown in FIGS. 1 and 2. As with FIG. 3, for each key in FIG. 4 the priority rank is shown as a superscript to the symbol associated with the key function. The ranking scheme shown in FIG. 3 and described above may be most appropriate for a keypad for which in normal use a pointing object approaches from, and extends along, a direction which is substantially parallel with the columns of the keys. Thus keys in the same row are assigned equal priorities. However, for the ranking scheme shown in FIG. 4, the keys are assigned a priority ranking according primarily to their row, but also according to their column. Thus keys in the top row are ranked higher than keys in the next row down, which themselves are ranked higher than keys in the next row down, and so on. Furthermore, within each row, keys in the left column are ranked higher than keys in the centre column, and keys in the centre column are in turn ranked higher than keys in the right column. This ranking scheme may be more appropriate for a keypad for which in normal use a pointing object approaches from the lower right of the keypad (for the orientation shown in FIG. 4). This might be the case, for example, for a mobile telephone keypad with a predominantly right-handed user. E.g. the user may cradle the telephone in the palm of his right hand and use his thumb as a pointing object, or hold the telephone in his left hand and use his right forefinger as a pointing object. In both of these cases there is an increased risk that keys to the right of an intended key will have their output signals unduly increased by the user's thumb/fingertip being relatively near to them and the body of the thumb/finger passing over them. Thus keys towards the left-hand side of the keypad are assigned priority rankings (indicated by a higher numerical superscript in the figure) than keys towards the right-hand side of the keypad. (A left-right reversal of this ranking scheme may be better for a keypad to be used predominantly by a left-handed user. The UI may thus be configured to allow the user to select between ranking schemes).

FIG. 5 is similar to and will be understood from FIGS. 3 and 4. For the ranking scheme represented in FIG. 5, the keys are again assigned a priority ranking according primarily to their row, and as with FIG. 4 are also prioritized according to their column. However, the rankings according to column are different from those of FIG. 4. The row ranking is broadly the same in that keys in the top row are ranked higher than keys in the next row down, which themselves are ranked higher than keys in the next row down, and so on. However, within each row, keys in the left column and right column are ranked equal and higher than keys in the centre column. This ranking scheme may be preferred for a keypad for which in normal use a pointing object approaches from either the lower left or the lower right of the keypad (for the orientation shown in the figure). This might be the case, for example, for a mobile telephone keypad which may be used with either left-handed or right-handed users, or for a device held between the palms of both hands with both thumbs being used as pointing objects. The principle underlying the ranking scheme shown in FIG. 5 is that if a pointing object approaches from the right and intends to select key "4", key "5" is less likely to be wrongly reported as the selected key because it is suppressed by virtue of its lower ranking. Key "6", on the other hand, has the same ranking as key "4". However, key "6" will in general be less likely to be wrongly selected if a user intends to select key "4" because it will be further away from his finger tip and, so will be expected to display a significantly lower output signal (i.e. there is less chance of a non-immediate neighbor key being wrongly selected than for an immediate neighbor key. Thus it is not so significant that it has the same ranking). The same applies for a pointing object approaching from the left and intending to select key "6" (i.e. key "5" is suppressed by virtue of its lower ranking, and key "4" will be unlikely to be selected because of its greater distance from the user intended key "6").

As will be readily understood, the specific details of any given priority ranking scheme, e.g. the appropriate scale factors or absolute rankings for the different keys, will depend on the specific keyboard layout at hand, the relative sizes of the keys, the spacing between them relative to the size and shape of the pointing object, the normal orientation of the keyboard in use, and the nature of the pointing object, and the direction in which the pointing object normally moves towards and over the keyboard when selecting a key. The specific details of the ranking scheme can thus be determined experimentally by identifying which keys during normal use of a particular keyboard layout have a tendency to be wrongly selected when no ranking scheme being used, and providing these keys with an accordingly lower ranking to suppress them.

For example, consider a keyboard having 3 keys "A", "B" and "C". In an experiment the keys are equally ranked and a user presses each key 100 times in the manner expected during normal use (i.e. approaching the keypad with the normal pointing object from the normal-use direction). Because of the above-mentioned problems with determining a correct key selection it is assumed the controller wrongly determines that key "A" is selected 150 times, key "B" 100 times, and key "C" 50 times. In view of these statistics, the keys may thus be ranked so that the output signal from key "A" is scaled by factor of two-thirds, the output signal from key "B" is scaled by factor of unity, and the output signal from key "C" is scaled by factor of two, for example.

Figure 6:
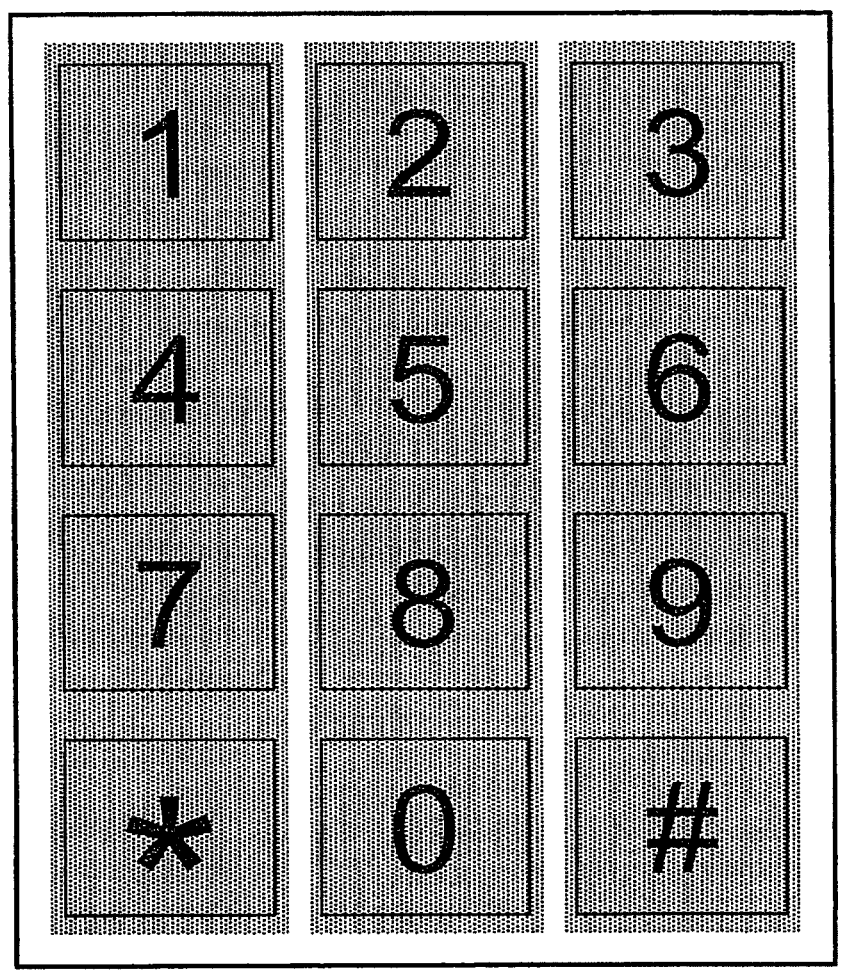
FIG. 6 schematically shows in plan view a sensing region portion of the UI shown in FIG. 1 with shading used to indicate three separate key groupings.

FIG. 6 schematically shows in plan view the sensing region portion of the UI shown in FIG. 2. FIG. 6 is thus similar to and will be understood from FIG. 2. However, portions of the UI shown in FIG. 6 are overlain with shading to represent some predefined key groupings (in this case three) which may be used in embodiments of the invention. The key groupings shown by the shading do not mean that the grouped keys share any particular characteristics which are different from keys in other groups, rather the groupings are notional and merely represent collections of keys which may be considered together and independently of other keys for some aspects of the process of determining a selected key according to some embodiments of the invention. As indicated in FIG. 6, keys "1", "4", "7" and "k" collectively form a first group of keys, keys "2", "5", "8" and "0" collectively form a second group of keys, and keys "3", "6", "9" and "#" collectively form a third group of keys. The inventors have found that improved reliability in key selection can be obtained if the process of determining a user intended key is performed in two stages. In a first stage the most likely key within each of the predefined groups is determined, for example, using the principles described above whereby keys are preferentially selected according to their position within the group, and in a second stage, the overall most-likely key of the most-likely keys from each group is determined.

For example, with reference to FIG. 6, the controller first considers only the output signals from keys within the first group (i.e. keys "1", "4", "7" and "*"), and determines which key within that group is to be deemed to be the selected key for that group (independently of the output signals from keys in the other groups). This may be considered an intermediate selected key. This is because although the key is selected from among the keys within the group, it may not be the finally determined user-selected key from the keypad as a whole since this may come from another group. The selection of the intermediate selected key from each group may be done by taking account of the output signals and the positions of the keys within the sensing region using any of the methods described above. In effect, in this stage the group of keys "1", "4", "7" and "*" is considered as a self-contained sensing region containing only four keys which is independent of other keys. The controller then does the same for the other two groupings. These two groupings are also in effect self-contained sensing regions. (It will be understood that the three key-groupings could equally be considered in a different order or in parallel.) Thus with this approach the UI may be considered as three separate and independent sensing regions. The result is therefore three independently selected (intermediate) keys, one from each group. (It is assumed here that there is at least one key in each group having output signal characteristics to meet the requirements for being considered in activation. However, in many cases it may be that there is no key within a group that can be considered in activation and thus a null-result (no key deemed selected) may be determined for that particular grouping of keys.)

The next stage is to determine which of the three intermediate independently selected keys is to be determined as the sole user-selected key. This may be done in a number of ways, for example, based on known techniques for selecting between multiple keys (e.g. greatest output signal, first to go into activation, etc.). Alternatively, the selection may be made in a manner similar to the scheme used to select the keys from within the separate groupings (i.e. by taking account of the positions of the keys selected in the first stage within the UI as a whole, possibly with the keys having different priority rankings in this stage compared to the first stage).

The preceding description, in particular with reference to FIG. 1, has focused on capacitive sensors based on what might be termed passive sensing techniques, i.e. sensors in which all of the electrodes defining the sensing areas in the sensing region are individually responsive to a capacitive coupling between a pointing object and respective ones of the sensing areas (i.e. sensors of the type described in U.S. Pat. No. 5,730,165 and U.S. Pat. No. 6,466,036). However, embodiments of the invention may also be based on what might be termed active capacitive sensing techniques, e.g. sensors in which sensitive areas are based on paired drive and receive electrodes (such as described in U.S. Pat. No. 6,452, 514). The drive and receive electrodes may be arranged in a matrix array where keys (sensing areas) are defined by overlap regions between row and column electrodes. With this type of sensor, changes in a capacitive coupling between a pointing object and respective ones of the sensing areas modify the transfer of a drive signal from the drive electrode to the receive electrode.

Furthermore, although the above description has focused on user interfaces comprising physically discrete sensing areas, embodiments of the invention may be based on a user interface having a continuous 2-D sensing region in which "virtual" sensing areas are defined. For example, a continuous 2-D region may be notionally divided into an array of virtual discrete keys.

It will also be appreciated that position sensors embodying the invention may incorporate a variety of additional features. For example, in some applications it is desirable to have a 'wakeup' function, whereby the entire device 'sleeps' or is in some quiescent or background state. In such cases, it is often desirable to have a wake signal from mere proximity of a human body part some distance away. The element can be driven as a single large capacitive electrode without regard to position location, while the unit is in the background state. During this state the electronic driver logic looks for a very small change in signal, not necessarily enough to process as a 2D coordinate, but enough to determine that an object or human is in proximity. The electronics then 'wakes up' the overall system and the element is driven so as to become a true position sensor once again.

Also, although the term "touch" may be used in this description, a position sensor of the kind described above can be sufficiently sensitive that it is able to register the location of an adjacent finger (or other object such as a stylus) without requiring physical contact. The term "touch" as used herein should therefore be interpreted accordingly.

It will be appreciated that although particular embodiments of the invention have been described, many modifications/additions and/or substitutions may be made within the scope of the present invention. Accordingly, the particular examples described are intended to be illustrative only, and not limitative. Furthermore, it will be understood from the above description that features of embodiments of the invention may be combined in ways other than those explicitly set out in the appended claims.

Other Embodiments

In studying this description, the reader may be aided by noting definitions of certain words and phrases used throughout this patent document. Wherever those definitions are provided, those of ordinary skill in the art should understand that in many, if not most instances, such definitions apply to both preceding and following uses of such defined words and phrases. At the outset of this description, one may note that the terms "include" and "comprise," as well as derivatives thereof, mean inclusion without limitation; the term "or," is inclusive, meaning and/or. The word 'key' as generally used in this disclosure refers to a touchable portion of a mechanical to electrical transducing device that is non-bistable in nature. This term specifically excludes conventional mechanical switches in which two or more electrical conductors are moved into or away from contact with each other to make or break an electrical connection. The terms 'keyboard', 'keypad' and the like all refer to arrays of keys for data input without limitation as to the size or configuration of the array. A 'key' can also be a dimensional sensing surface such as an XY touch screen or a 'trackpad', or a sensing zone not intended for normal human data entry such as an object or body part sensor. 'Touch' can mean either human or mechanical contact or proximity to a key. 'User' can mean either a human or a mechanical object. A 'finger' can be, inter alia, a human finger, a mechanical finger or a stylus. 'Upper' key can mean a key in an upwardly spaced location with respect to another key on a keypad. 'Lower' key can mean a key in a downwardly spaced location with respect to another key on a keypad.

Capacitive sensors, unlike bistable electromechanical switches which are either open or closed, provide a signal that varies with the degree of touch or extent or coupling between a user's finger and a sensing element of a keyboard. Other non-bistable touch sensors, such as an array of piezoelectric sensors in which the output from a given sensor increases with increasing activation force, share many of the properties of capacitive keys. Thus, much of the subsequent disclosure should be understood as being relevant to non-capacitive keys that also provide an output signal responsive to a degree of coupling between the key and a user's finger, stylus, or other key-activating or pointing implement that is proximate the key.

Figure 7:
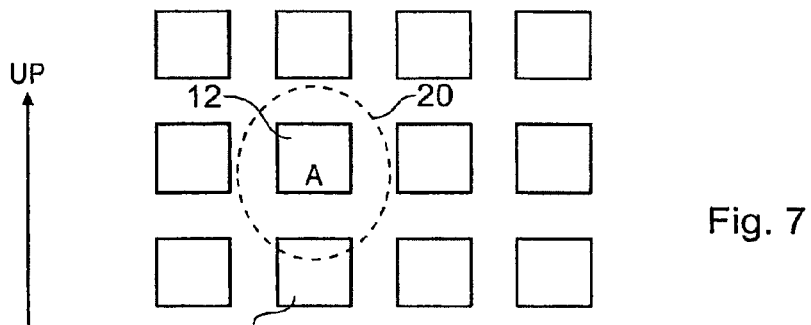
FIGS. 7 and 8 show an array of tightly spaced capacitive buttons.

Referring to FIG. 7, there is shown an array of 'N' tightly spaced capacitive keys in a key panel 10 which would benefit from the invention. When using such small key panels it is inevitable that a finger will encompass much more than the intended key. A finger touching a principle desired key electrode 12 could easily create a 'fingerprint' outline 20, as shown in dashed lines, where the fingerprint has a centroid location A. This fingerprint also encompasses key 14 other than the intended key. The amount of intersecting surface area between the dashed line and each key area is a reasonable representation of the amount of signal level change each intersected key will receive due to the touch, although even non-touched keys will also see an increase in signal due to mere finger proximity and to fringe-field effects within the touch panel.

In this case, the desire is to select the one and only one key which is intended by the user while suppressing outputs from adjacent keys intersected by the fingerprint. In this 'position-dependent' key suppression invention, the output signal from upper key 12 is favoured over the signal from lower key 14, albeit in this case that the signal from key 12 is stronger than that from key 14.

Figure 8:
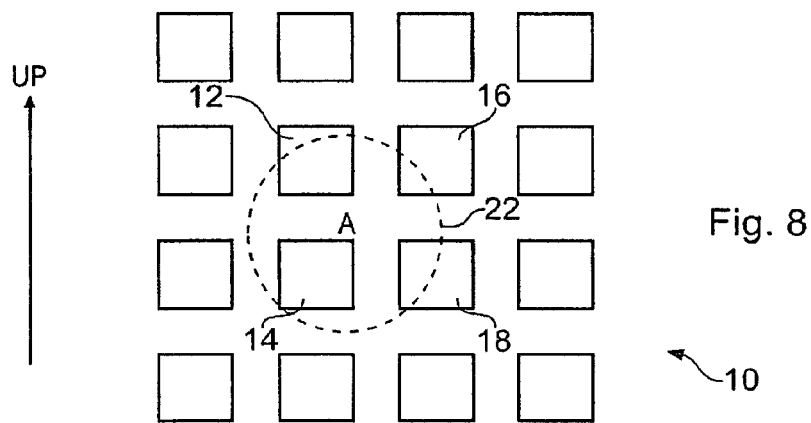
Figures 9A, 9B:
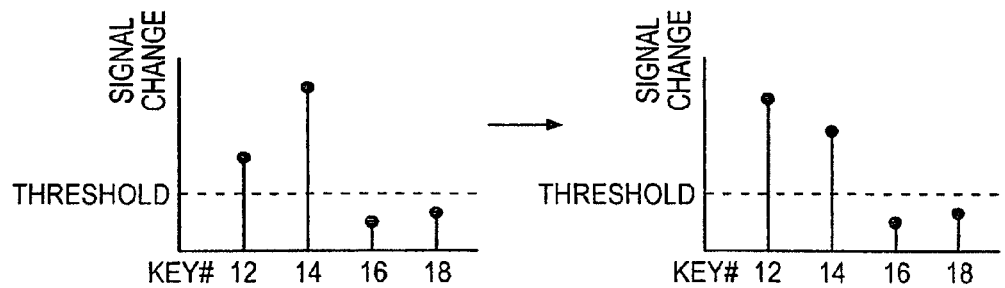
FIGS. 9(a) and 9(b) are graphical representations of signal magnitude associated with respective keys shown in FIG. 8 caused by capacitive coupling with a finger.

Referring to FIGS. 8 and 9, there is shown an array of capacitive keys in a key panel 10 in which a fingerprint represented by outline 22 (in dashed lines) encompasses four different keys 12, 14, 16, 18. The user's fingerprint 22 has a centroid location A which is just above key 14 and between keys 12,14. An output signal is measured from each of keys 12, 14, 16, 18, but the signal from key 14 has the maximum strength because the fingerprint outline 22 encompasses the whole of key 14. As shown in FIG. 9(a), the signal from each of keys 12 and 14 is above a threshold value. Key 14 would initially be the favoured key. However, as shown in FIG. 9(b) in accordance with the invention, the output signal from key 14 is suppressed and the output signal from key 12 is enhanced, so that the upper key 12 'wins' and becomes the user-selected key. In the invention, the signals from keys 14, 16, 18 can be suppressed and/or the signal from key 12 can be enhanced. Therefore, the invention allows an upper key (key 12 in FIG. 8) having a weaker signal to become dominant with respect to a lower key (key 14 in FIG. 8) having a stronger signal, even if the measured signal from key 12 is below a threshold value. Signal enhancement can be directed to the 'intended' key 12 due to the upper position of the key in the region of keys that are touched. An algorithm may be executed by a controller to enhance or activate the measured signal from key 12. In an alternative embodiment, the keypad comprising an array of capacitive keys may be in the form of a capacitive touch screen or touch pad.

Figure 10:
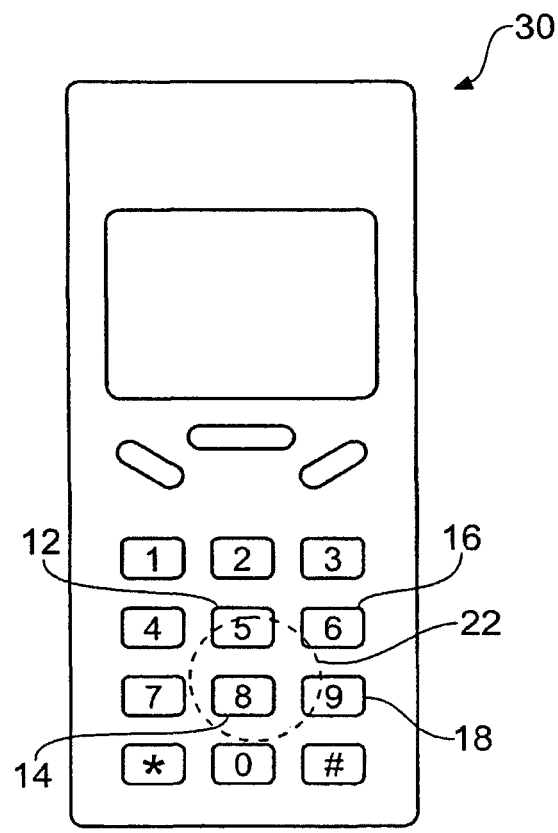
FIG. 10 schematically shows a mobile phone handset having an array of tightly spaced capacitive buttons.

Referring to FIG. 10, there is shown a mobile phone handset 30 comprising an array of capacitive keys in a key panel similar to that shown in FIG. 8. The corresponding features in FIG. 10 have the same reference numerals as those in FIG. 8. The output signal from key 12 (representing no. 5 on the key panel) is enhanced with respect to the signal from key 14 (representing no. 8 on the key panel) so that key 12 becomes the user-selected key. The invention is particularly useful where a user inadvertently touches keys 14 and 18, despite wishing to press the intended key 12.

Figure 11:
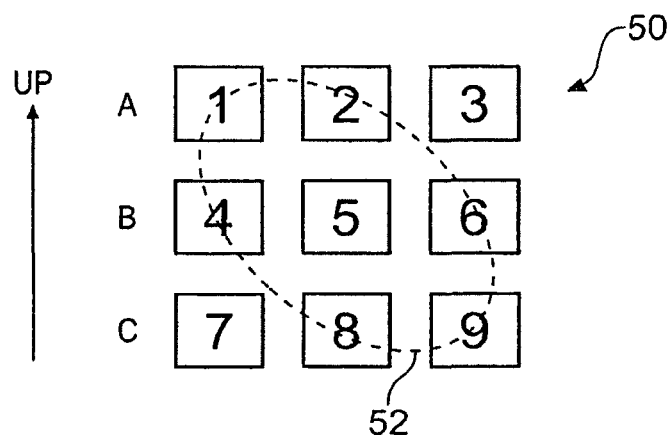
FIG. 11 schematically shows a keypad of a mobile phone handset.

Referring to FIG. 11, there is shown an array of closely spaced capacitive keys in a key panel 50 which may form part of a mobile phone handset. The keys of the key panel 50 represent numerals 1 to 9. Keys 1, 2 and 3 are located on an upper level designated A of the key panel 50; keys 4, 5 and 6 are located on a middle level designated B; and keys 7, 8 and 9 are located on a lower level designated C of the key panel. A fingerprint represented by outline 52 (in dashed lines) encompasses 7 different keys 1, 2, 4, 5, 6, 8, 9. The user's fingerprint 52 has a centroid location which is on key number 5. The amount of intersecting surface area between the dashed line and each key area is a reasonable representation of the amount of signal level change each intersected key will receive due to the touch. Often when a user's finger approaches an intended key to be selected, the finger is at an angle to the keys on the key panel. The finger outline 52 illustrates a touch on the key panel 50 which is at an angle to the keys as the finger (not shown) touches the key panel. The intended key to be selected by the user is key number 1 on upper level A. The tip of the finger touches key 1, however the fingerprint also encompasses keys 2, 4, 5, 6, 8 and 9. The output signal from key 5 has the maximum signal strength. The signals from keys 1, 2, 4 and 8 are above a threshold value. Key 5 would initially be the favoured key as it has the highest signal strength, but in accordance with the invention keys 1 and 2 on the upper level A are selected by enhancing their signal strength and suppressing the signals from keys 4, 5, 6, 8 and 9. The invention preferentially selects an upper key based on its position in relation to other keys and based on the angle of touch by a person's finger.

In this case, the output signal from each of keys 1 and 2 caused by capacitive coupling with a user's finger is above a threshold value and of substantially the same strength. An algorithm may be executed by a controller to ignore the signals from keys 1 and 2 until the user moves his finger away from key 2 to the intended key 1 so that the signal from key 2 is reduced.

If a user touches two keys on the same level of the key panel, for example keys 7 and 8 on lower level C, then the DI system disclosed in U.S. Ser. No. 11/279,402 (published as US 2006-0192690 A1) may be used to select the desired key.

In an alternative embodiment, the output signal from the intended key 1 may not need to be enhanced to make it the user-selected key. An algorithm executed by a controller may be able to process the signals from keys 1, 2, 4, 5, 6, 8 and 9 and make key 1 the user-selected key based on the vector of touch illustrated in FIG. 11. An algorithm can be arranged to process different vectors of touch so as to determine the user-selected key, in this case the key 1 on upper level A.

There are, of course, many possible variations and extensions of the procedure. For example, one may consider a rare case in which a user brings his or her finger up to a keyboard so that the point of touch is exactly between two keys. In this case, one could modify the depicted process to either select just one of those keys (e.g., by means of a known pseudo-random number selection algorithm, or by sample sequence order) or by suppressing the output of both keys until the user move his or her finger enough that one of the two keys had a higher output than the other.

Furthermore, although the above description has focussed on capacitive sensing technologies, embodiments of the invention may be based on other coupling mechanisms, e.g. magnetic coupling mechanisms. For example, the sensing areas may be provided by magnetic field sensors and a pointing object may be magnetized do that the magnetic field sensors are sensitive to its proximity. Other non-contact coupling mechanisms could also be used.

Thus apparatus and methods are described for selecting which of a plurality of simultaneously activated keys in a keyboard based on capacitive sensors is a key intended for selection by a user. In embodiments of the invention keys are preferentially selected as the user intended key based on their positions within the keyboard. Thus a key which is frequently wrongly activated when a user selects another key, e.g. because the key is adjacent the intended key and the user normally passes his finger over it while approaching the desired key, can be suppressed relative to the desired key based on their relative positions. For example, keys may be associated with predefined rankings according to their position within the keyboard and in use keys are preferentially select according to their rankings. Alternatively, signals from the keys may be scaled by weighting factors associated with their positions and a key selected according to the weighted signals.

The invention claimed is:

1. A method comprising, by one or more computing devices:
   receiving two or more output signals responsive to two or more capacitive couplings, each of the capacitive couplings occurring between a pointing object and one of two or more sensing areas within a sensing region, each of the sensing areas having a position within the sensing region; and
   if two or more of the output signals each have an output-signal level that exceeds a predefined activation level, then selecting a particular one of the sensing areas with output-signal levels exceeding the predefined activation level as an intended one of the sensing areas, the particular one of the sensing areas selected based on a predefined ranking scheme that prioritizes the two or more sensing areas based on the positions of the two or more sensing areas within the sensing region.

2. The method of claim 1, wherein each of the sensing areas has a predefined ranking based on its position.

3. The method of claim 2, wherein, according to the predefined ranking scheme, a sensing area with a higher predefined ranking is selected over a sensing area with a lower predefined ranking.

4. The method of claim 3, wherein, according to the predefined ranking scheme, among two or more sensing areas with a same predefined ranking, a sensing area that has a higher output-signal level is selected over a sensing area that has a lower output-signal level.

5. The method of claim 1, wherein:
   the predefined ranking scheme applies a weighting to the output-signal level of each of the sensing areas with output-signal levels exceeding the predefined activation level; and
   the particular one of the sensing areas selected based on the predefined ranking scheme has a highest output-signal level, as weighted by the predefined ranking scheme, among the sensing areas with output-signal levels exceeding the predefined activation level.

6. The method of claim 1, wherein:
   the sensing areas are arranged in rows;
   each of the rows has a predefined ranking; and
   according to the predefined ranking scheme, a sensing area in a row with a higher predefined ranking is selected over a sensing area in a row with a lower predefined ranking.

7. The method of claim 1, wherein:
   the sensing areas are arranged in columns;
   each of the columns has a predefined ranking; and
   according to the predefined ranking scheme, a sensing area in a column with a higher predefined ranking is selected over a sensing area in a column with a lower predefined ranking.

8. The method of claim 1, wherein:
   the sensing areas are divided into two or more groups that each comprise two or more of the sensing areas;
   if two or more of the sensing areas with output-signal levels exceeding the predefined activation level are in different groups, then according to the predefined ranking scheme:
     in each of the different groups, one of the sensing areas is selected as an intermediate one of the sensing areas in a first stage of the predefined ranking scheme; and
     one of the intermediate ones of the sensing areas is selected as the intended one of the sensing areas in a second stage of the predefined ranking scheme.

9. The method of claim 1, wherein:
the sensing region comprises a keyboard and one or more of the sensing areas comprises a key of the keyboard; or
the sensing region comprises a keypad and one or more of the sensing areas comprises a key of the keypad.

10. The method of claim 1, wherein the pointing object is a human finger or a stylus.

11. The method of claim 1, wherein, according to the predefined ranking scheme, an upper one of the sensing areas is selected over a lower one of the sensing areas.

12. The method of claim 1, wherein the predefined ranking scheme takes into account a vector of touch of the capacitive couplings between the pointing object and the sensing areas within the sensing region.

13. One or more computer-readable non-transitory storage media embodying logic that is operable when executed to:
receive two or more output signals responsive to two or more capacitive couplings, each of the capacitive couplings occurring between a pointing object and one of two or more sensing areas within a sensing region, each of the sensing areas having a position within the sensing region; and
if two or more of the output signals each have an output-signal level that exceeds a predefined activation level, then select a particular one of the sensing areas with output-signal levels exceeding the predefined activation level as an intended one of the sensing areas, the particular one of the sensing areas selected based on a predefined ranking scheme that prioritizes the two or more sensing areas based on the positions of the two or more sensing areas within the sensing region.

14. The media of claim 13, wherein each of the sensing areas has a predefined ranking based on its position.

15. The media of claim 14, wherein, according to the predefined ranking scheme, a sensing area with a higher predefined ranking is selected over a sensing area with a lower predefined ranking.

16. The media of claim 15, wherein, according to the predefined ranking scheme, among two or more sensing areas with a same predefined ranking, a sensing area that has a higher output-signal level is selected over a sensing area that has a lower output-signal level.

17. The media of claim 13, wherein:
the predefined ranking scheme applies a weighting to the output-signal level of each of the sensing areas with output-signal levels exceeding the predefined activation level; and
the particular one of the sensing areas selected based on the predefined ranking scheme has a highest output-signal level, as weighted by the predefined ranking scheme, among the sensing areas with output-signal levels exceeding the predefined activation level.

18. The media of claim 13, wherein:
the sensing areas are arranged in rows;
each of the rows has a predefined ranking; and
according to the predefined ranking scheme, a sensing area in a row with a higher predefined ranking is selected over a sensing area in a row with a lower predefined ranking.

19. The media of claim 13, wherein:
the sensing areas are arranged in columns;
each of the columns has a predefined ranking; and
according to the predefined ranking scheme, a sensing area in a column with a higher predefined ranking is selected over a sensing area in a column with a lower predefined ranking.

20. The media of claim 13, wherein:
the sensing areas are divided into two or more groups that each comprise two or more of the sensing areas;
if two or more of the sensing areas with output-signal levels exceeding the predefined activation level are in different groups, then, according to the predefined raking ranking scheme:
in each of the different groups, one of the sensing areas is selected as an intermediate one of the sensing areas in a first stage of the predefined ranking scheme; and
one of the intermediate ones of the sensing areas is selected as the intended one of the sensing areas in a second stage of the predefined ranking scheme.

21. The media of claim 13, wherein:
the sensing region comprises a keyboard and one or more of the sensing areas comprises a key of the keyboard; or
the sensing region comprises a keypad and one or more of the sensing areas comprises a key of the keypad.

22. The media of claim 13, wherein the pointing object is a human finger or a stylus.

23. The media of claim 13, wherein, according to the predefined ranking scheme, an upper one of the sensing areas is selected over a lower one of the sensing areas.

24. The media of claim 13, wherein the predefined ranking scheme takes into account a vector of touch of the capacitive couplings between the pointing object and the sensing areas within the sensing region.

25. An apparatus comprising:
a touch-sensitive user interface; and
one or more computer-readable non-transitory storage media coupled to the touch-sensitive user interface that embody logic operable when executed to:
receive two or more output signals responsive to two or more capacitive couplings, each of the capacitive couplings occurring between a pointing object and one of two or more sensing areas within a sensing region of the touch-sensitive user interface, each of the sensing areas having a position within the sensing region; and
if two or more of the output signals each have an output-signal level that exceeds a predefined activation level, then select a particular one of the sensing areas with output-signal levels exceeding the predefined activation level as an intended one of the sensing areas, the particular one of the sensing areas selected based on a predefined ranking scheme that prioritizes the two or more sensing areas based on the positions of the two or more sensing areas within the sensing region.

26. The apparatus of claim 25, wherein each of the sensing areas has a predefined ranking based on its position.

27. The apparatus of claim 26, wherein, according to the predefined ranking scheme, a sensing area with a higher predefined ranking is selected over a sensing area with a lower predefined ranking.

28. The apparatus of claim 27, wherein, according to the predefined ranking scheme, among two or more sensing areas with a same predefined ranking, a sensing area that has a higher output-signal level is selected over a sensing area that has a lower output-signal level.

29. The apparatus of claim 25, wherein:
the predefined ranking scheme applies a weighting to the output-signal level of each of the sensing areas with output-signal levels exceeding the predefined activation level; and
the particular one of the sensing areas selected based on the predefined ranking scheme has a highest output-signal level, as weighted by the predefined ranking scheme, among the sensing areas with output-signal levels exceeding the predefined activation level.

30. The apparatus of claim 25, wherein:
the sensing areas are arranged in rows;
each of the rows has a predefined ranking; and
according to the predefined ranking scheme, a sensing area in a row with a higher predefined ranking is selected over a sensing area in a row with a lower predefined ranking.

31. The apparatus of claim 25, wherein:
the sensing areas are arranged in columns;
each of the columns has a predefined ranking; and
according to the predefined ranking scheme, a sensing area in a column with a higher predefined ranking is selected over a sensing area in a column with a lower predefined ranking.

32. The apparatus of claim 25, wherein:
the sensing areas are divided into two or more groups that each comprise two or more of the sensing areas;
if two or more of the sensing areas with output-signal levels exceeding the predefined activation level are in different groups, then, according to the predefined ranking scheme:
in each of the different groups, one of the sensing areas is selected as an intermediate one of the sensing areas in a first stage of the predefined ranking scheme; and
one of the intermediate ones of the sensing areas is selected as the intended one of the sensing areas in a second stage of the predefined ranking scheme.

33. The apparatus of claim 25, wherein:
the sensing region comprises a keyboard and one or more of the sensing areas comprises a key of the keyboard; or
the sensing region comprises a keypad and one or more of the sensing areas comprises a key of the keypad.

34. The apparatus of claim 25, wherein the pointing object is a human finger or a stylus.

35. The apparatus of claim 25, wherein, according to the predefined ranking scheme, an upper one of the sensing areas is selected over a lower one of the sensing areas.

36. The apparatus of claim 25, wherein the predefined ranking scheme takes into account a vector of touch of the capacitive couplings between the pointing object and the sensing areas within the sensing region.

37. The apparatus of claim 25, wherein the touch-sensitive user interface is a touchscreen or touchpad.

\* \* \* \* \*

UNITED STATES PATENT AND TRADEMARK OFFICE
CERTIFICATE OF CORRECTION

PATENT NO.       : 8,791,910 B2                                   Page 1 of 1
APPLICATION NO.  : 13/043231
DATED            : July 29, 2014
INVENTOR(S)      : Harald Philipp It is certified that error appears in the above-identified patent and that said Letters Patent is hereby corrected as shown below:

In the Claims

Col. 20, Ln. 6: After "predefined" and before "ranking" delete "raking".

Signed and Sealed this
Seventeenth Day of March, 2015

Michelle K. Lee
*Director of the United States Patent and Trademark Office*